United States Patent [19]

Taylor

[11] Patent Number: 4,876,584
[45] Date of Patent: Oct. 24, 1989

[54] ELECTROSTATIC DISCHARGE PROTECTION CIRCUIT

[75] Inventor: Clive R. Taylor, Stevenage, England

[73] Assignee: British Aerospace plc, London, England

[21] Appl. No.: 93,701

[22] Filed: Sep. 8, 1987

[30] Foreign Application Priority Data

Sep. 10, 1986 [GB] United Kingdom ................. 8621839

[51] Int. Cl.$^4$ ............................................. H01L 79/78
[52] U.S. Cl. .................................. 357/23.13; 357/42; 357/68
[58] Field of Search .................. 357/23.13, 51, 68, 42, 357/13, 35; 361/56, 91

[56] References Cited

U.S. PATENT DOCUMENTS

| 4,513,309 | 4/1985 | Cricchi ................................. 357/42 |
| 4,605,980 | 8/1986 | Hartranft et al. ............. 357/23.13 X |
| 4,633,283 | 12/1986 | Avery ............................... 357/23.13 |

FOREIGN PATENT DOCUMENTS

| 57-164571 | 10/1982 | Japan ................................. 357/23.13 |
| 59-92557 | 5/1984 | Japan ................................. 357/23.13 |
| 59-224164 | 12/1984 | Japan ................................. 357/23.13 |
| 61-263276 | 11/1986 | Japan ................................. 357/23.13 |

Primary Examiner—Andrew J. James
Assistant Examiner—Sara W. Crane
Attorney, Agent, or Firm—Nixon & Vanderhye

[57] ABSTRACT

An integrated circuit device including a substrate (2), power supply buses ($V_{DD}$, $V_{SS}$), and a number of terminal pads (1) has an electrostatic discharge protection circuit associated with one of its terminal pads (1). The protection circuit comprises a diode (D1) directly connected between the pad (1) and one of the power supply buses ($V_{DD}$, $V_{SS}$), a punchthrough transistor (TR1) directly connected to the other one of the power supply buses ($V_{DD}$, $V_{SS}$) and a resistive path (R1) connecting the pad (1) to the remainder of the integrated circuit. Static charges applied to the pad (1) are transmitted to the one or the other power supply bus ($V_{DD}$, $V_{SS}$) via the diode (D1) or the punchthrough transistor (TR1) rather than being transmitted to the remainder of the integrated circuit. In a preferred embodiment the diode (D1) and transistor (TR1) are formed by the substrate (2) in combination with diffusion regions of a different conductivity to the substrate (2) underlying the pad (1) and further diffusion regions (5, 8) formed along the sides of the pad (1).

4 Claims, 4 Drawing Sheets

ELECTROSTATIC DISCHARGE PROTECTION CIRCUIT

Electrostatic discharge is a major hazard for metal oxide semiconductor very large scale integrated circuits. With the increasing level of complexity and hence miniaturization of the individual components on an integrated circuit the effect of electrostatic discharges become greater. Also the trend to very thin gate oxide film in such devices aggravates this problem and the high speed of such integrated circuits cannot tolerate the signal delays resulting from protection circuits having a high series resistance. With increasing miniaturization electrostatic discharge can also affect bipolar circuits.

One example of a protection circuit included in an integrated circuit device to dissipate any applied electrostatic discharge is disclosed in the I.E.E.E. Journal of Solid State Circuits, Volume SC-20, Number 2, April 1985, in an article entitled "Optimised ESD protection circuits for high-speed MOS/VLSR" by Fujishin, Garrett, Levis, Motta and Hartranft. This protection circuit comprises a diffused resistor/distributed diode through which a terminal pad is connected to the remainder of the integrated circuit with a thick-oxide punchthrough device and a thick-oxide field transistor connecting the diffused resistor/distributed diode to the ground line, and a gate-drain connected thin oxide device connecting the diffused resistor/distributed diode to a power line.

With this arrangement positive static pulses are conducted to earth by the thick-oxide field transistor or the punchthrough device. Both of these have a threshold voltage of between 20 and 30 volts and these thus provide no protection against low voltage pulses. However, the thin oxide gate-drain connected device turns on at about 1 volt and so provides protection against lower voltage pulses. The thin oxide device operates in saturation and pulls down the preselected node voltage to acceptable levels for thin gate oxide circuitry. Protection against negative pulses is provided by the diffused resistor/distributed diode structure with additional protection being provided by parasitic n-p-n bipolar transistors with a reverse bias emitter-base junction formed by the drain and the substrate of the punchthrough transistor and field oxide transistor.

The use of field oxide and thin oxide transistor structures as diode clamps provide a reliability hazard through the hot electron/hole effects that occur near a silicon/silicon oxide interface which cause significant shift and instability in their threshold voltage.

According to this invention an integrated circuit device including a substrate, power supply buses, and a number of terminal pads has an electrostatic discharge protection circuit associated with one of its terminal pads, the protection circuit comprising a diode directly connected between the pad and one of the power supply buses, a punchthrough transistor directly connected to the other power supply bus and a resistive path connecting the pad to the remainder of the integrated circuit so that static charges applied to the pad are transmitted to the one or the other power supply bus via the diode or the punchthrough transistor rather than being transmitted to the remainder of the integrated circuit.

In the past the devices used in electrostatic discharge protection circuits had a similar size to those used in the remaining active devices of the integrated circuit. As the degree of miniaturization of the integrated circuits have increased this has further reduced the protection afforded by conventional electrostatic discharge protection circuits since such small components are not able to cope with the static charges that can be applied to the terminals of such devices.

Preferably therefore the electrostatic discharge protection circuit for an integrated circuit device formed on a substrate of one conductivity type comprises a first diffusion region of the other conductivity type underlying the pad, a second diffusion region of the one conductivity type adjacent one side of the pad and connected to the one power supply bus so that the first and second diffusion regions form the diode, a third diffusion region of the other conductivity type spaced from the first region and adjacent another side of the pad, the third region being connected to the other power supply bus so that the substrate and the first and third diffusion regions form the punchthrough transistor, and the resistive path is connected to the first region of other conductivity type and leads to the remainder of the integrated circuit.

Preferably the second diffusion region is formed along two adjacent sides of the pad and the third diffusion region is formed along the other two adjacent sides of the pad. By forming the diode and the punchthrough transistor along the sides of the pad these devices are formed with a large perimeter which provides them with a large power handling capability. This is many times greater than that of the remainder of the active components incorporated in the integrated circuit device.

Preferably the protection circuit also includes a pair of diodes connected in series in a reverse bias configuration between the one and other power supply buses with the node between the diodes being connected to the end of the resistive path remote from the pad. This additional pair of diodes which provide a second stage of diode clamps in the protection circuit eliminate transients still further.

Preferably the second stage diode clamps are also formed around the pad and, in this case, the protection circuit includes a fourth region of the other conductivity type connected to the end of the resistive path and located adjacent the second diffusion region, a fifth diffusion region of the one conductivity type which is also connected to the other power supply bus located adjacent the fourth region to form with the fourth region a first of the pair of diodes, a sixth diffusion region of the one conductivity type which is connected in series with the fourth diffusion region and a seventh diffusion region of the other conductivity type which is connected to the one power supply bus and is arranged adjacent the sixth diffusion region to form the second of the pair of diodes. Preferably the fourth and fifth diffusion regions are adjacent at least part of the second diffusion region along one side of the pad and preferably the sixth and seventh diffusion regions are adjacent at least part of the third diffusion region along another side of the pad. Preferably the sixth and seventh diffusion regions are located in a well of the other conductivity type.

The resistance of the resistive path is typically of the order of 900 ohm which is low compared to the resistance of resistances used as part of conventional input protection circuits and, as such, does not significantly slow down the speed of operation of the circuit.

The present invention by eliminating the distributed diode/series resistor leading from the terminal pad of a conventional protection circuit and its replacement by a diode and punchthrough transistor connected directly between the pad and power supply buses means that the substrate contact of the integrated circuit is not used as the discharge path for any applied static charges which is an advantage.

A particular example of an electrostatic discharge input protection circuit in accordance with this invention will now be described with reference to the accompanying drawings, in which.

The first example comprises a PIN diode D1 connected directly between a bonding pad 1 on the surface of a n-type semiconductor substrate 2 and a positive power supply bus $V_{DD}$. A punchthrough transistor TR1 is connected directly between the pad 1 and a negative power supply bus $V_{SS}$. A resistive path R1 is connected to the node between the diodes D1 and transistor TR1 and the remainder of the circuit on the integrated circuit chip (not shown).

In use, when static charges are applied to terminal pins of the device and are transferred to the bonding pad 1 positive charges are conducted by PIN diode D1 to the positive power supply bus $V_{DD}$ and negative charges having a voltage exceeding the threshold voltage of the breakthrough transistor TR1 are conducted through to the negative power supply bus $V_{SS}$. Typically resistor R1 has an impedance of 900 ohms.

Figure 1:
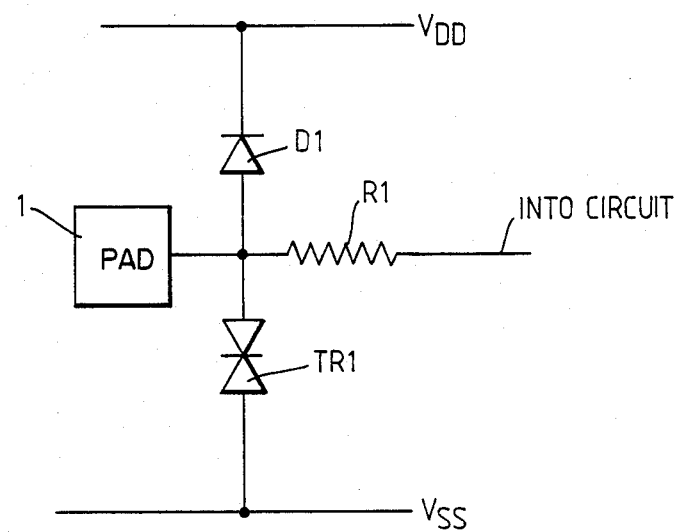
FIG. 1 is an equivalent circuit diagram of a first example of protection circuit.
Figure 4:
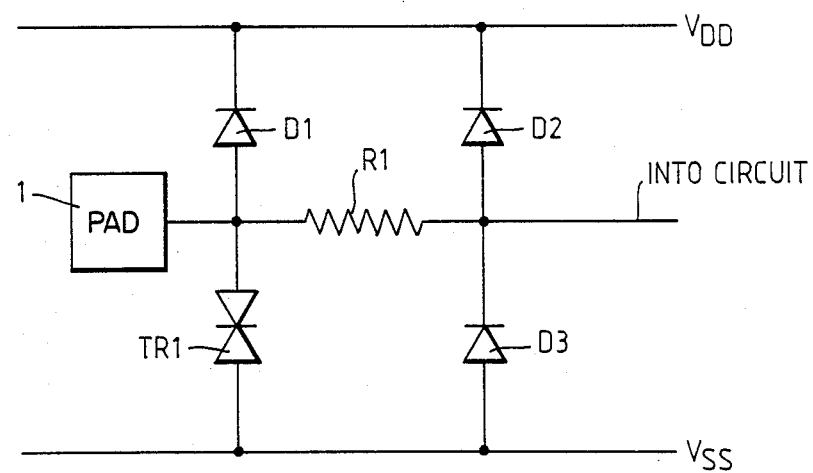
FIG. 4 is an equivalent circuit diagram of a second example.
Figure 3:
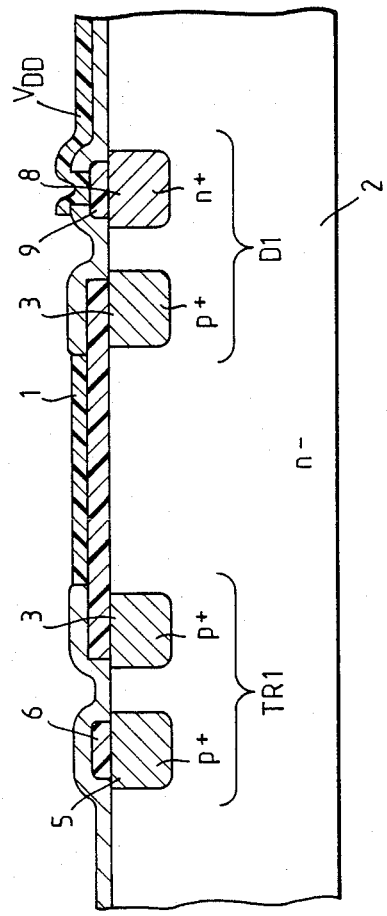
FIG. 3 is a section along the line 3—3 shown in FIG. 2.

The protective circuit as shown in FIG. 1 is created by forming a p+ diffusion region 3 so as to underlie the periphery of the bonding pad 1. A p— region 4 connected to the p+ region 3 provides the resistor R1 and a further p+ diffusion region 5 is generally L-shaped and extends parallel to two sides of the bonding pad 1. The L-shaped diffusion region 5 is connected to the negative power supply bus $V_{SS}$ via a metal electrode 6 and contact windows 7. The diffusion regions 3 and 5 together with the n— type substrate 1 form the pnp punchthrough transistor TR1 as best seen in FIG. 3. N+ diffusion regions 8 lie alongside the region 3 along the other two sides of the bonding pad 1 and these are connected via metal electrodes 9 to the positive power supply bus $V_{DD}$ via contact window 10. The p+ diffusion region 3 along two sides of the bonding pad 1 and the n+ diffusion region 8 form the PIN diode D1 as shown most clearly in FIG. 3.

Figure 2:
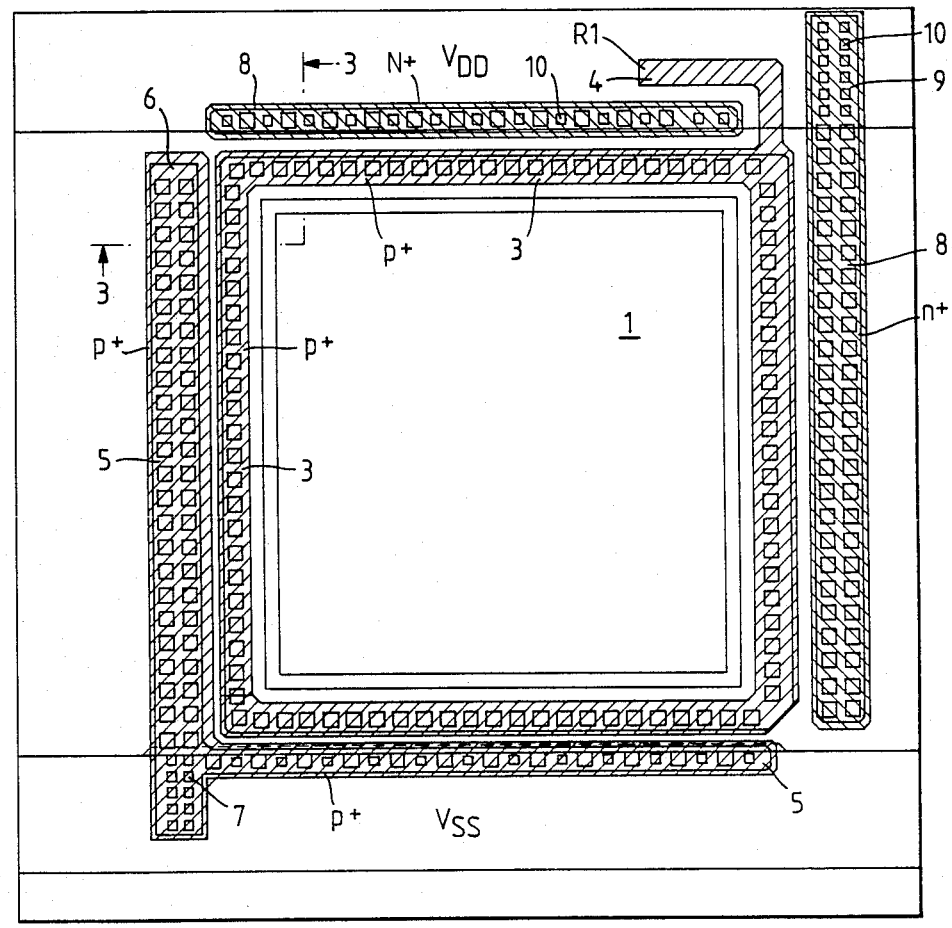
FIG. 2 is a plan of the mask patterns used to form the circuit.

Due to the point charge effect it is the perimeter of both the diode D1 and that of the transistor TR1 which are the principle factors determining the power handling capacity. The long narrow structures shown in FIG. 2 are very efficient at handling large powers and consequently can readily handle any static charges likely to be transferred to the bonding pad 1 from the terminal pin of a packaged integrated circuit device. Their elongate structure offers low capacitance whilst maintaining the current handling ability.

The second example is identical to the first but includes additional secondary diode voltage clamps formed by PIN diodes D2 and D3 which are connected in series with reverse bias configuration between the positive power supply bus $V_{DD}$ and the negative power supply bus $V_{SS}$. The node between the two diodes D2 and D3 is connected to the end of the resistor R1 remote from the bonding pad 1 and is also connected to the remainder of the circuit (not shown). The secondary diode voltage clamps D2 and D3 minimise any voltage transient passing through the resistor R1.

Figure 6:
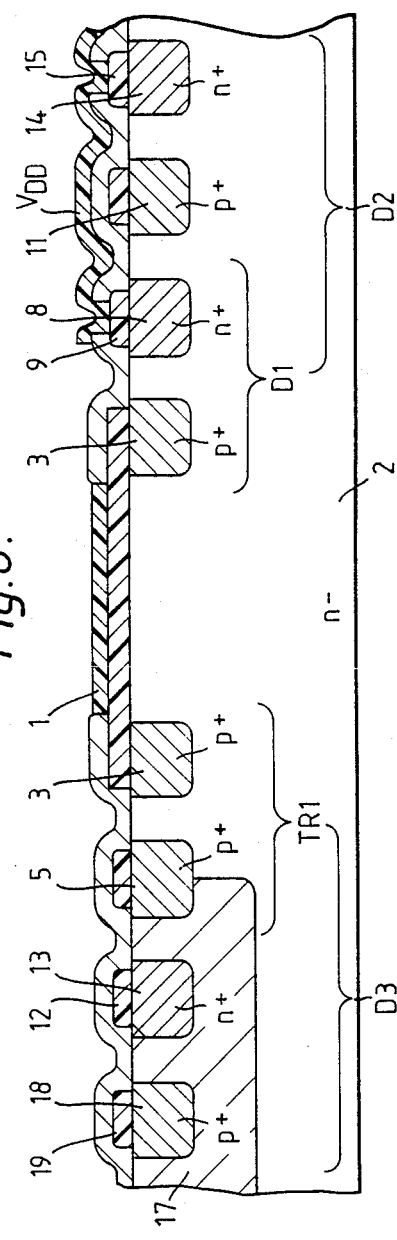
FIG. 6 is a section along the line 6—6 shown in FIG. 5.
Figure 5:
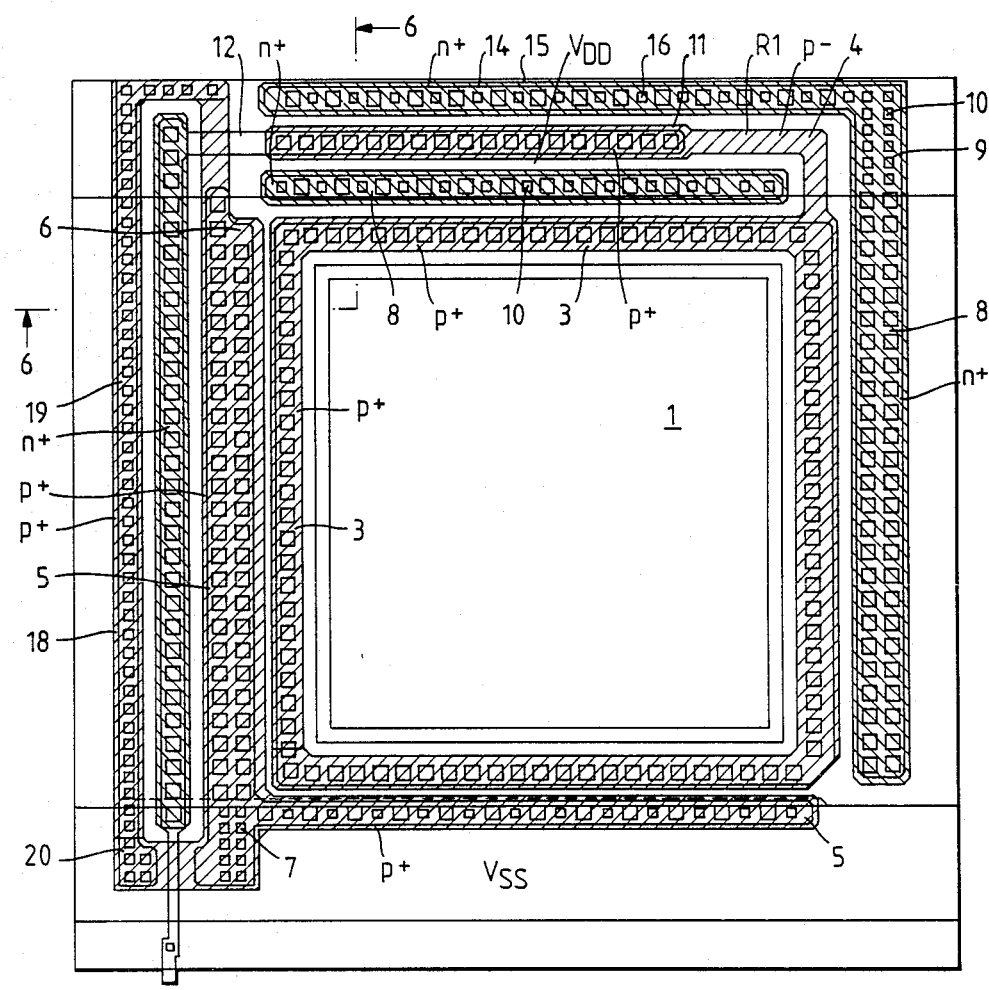
FIG. 5 is a plan of the mask pattern used to form the circuit.

The diodes D2 and D3 are again formed around the bonding pad 1 as shown in FIG. 5. The end of the p— resistive track 4 is connected to a further p+ diffusion region 11 and thence via a metal wiring layer 12 to an n+ region 13. The region 13 is then connected to the remainder of the circuit (not shown). The p+ region 11 lies adjacent n+ region 14 which is connected to the positive power supply bus $V_{DD}$ via an electrode 15 and contact window 16. The p+ region 11, n+ region 8, and n+ region 14 provide the PIN diode D2 as best seen in FIG. 6. A p-type well 17 formed simultaneously with the resistive track 4 is formed beside the diffusion regions 3 and 5. A further p+ region 18 which is connected to the negative power supply bus $V_{SS}$ via an electrode 19 and contact windows 20 lies alongside the n+ diffusion region 13 in the p-type well 17. The n+ diffusion region 13, p-type well 17, n+ diffusion region 5, and p+ diffusion region 18 form the PIN diode D3 as best seen in FIG. 6.

I claim:

1. An integrated circuit device including a substrate of one conductivity type, two power supply buses, a terminal pad on said substrate, said pad having at least two sides, said substrate comprising a first diffusion region of an other conductivity type underlying the pad, and an electrostatic discharge protection circuit associated with said terminal pad, the protection circuit comprising:

a diode directly connected between said pad and one of said power supply buses, said diode comprised of said first diffusion region and a second diffusion region of said one conductivity type, adjacent one side of the pad and connected to said power supply bus, said first and second diffusion regions forming said diode;

a punchthrough transistor directly connected between said pad and said other power supply bus, said punchthrough transistor comprised of a third diffusion region of said other conductivity type, spaced from said first region and adjacent an other side of said pad, said third region being connected to said other power supply bus so that the substrate, said first and third diffusion regions form said punchthrough transistor; and a resistive path connecting said pad to the remainder of said integrated circuit, said resistive path comprised of said other conductivity type, whereby static charges applied to the pad are selectively transmitted to said one and said other power supply buses by means of said diode and said punchthrough transistor, respectively, so that the remainder of the integrated circuit is protected from said static charges, in which the protection circuit also includes a pair of diodes connected in series in a reverse bias configuration between the one and the other power supply buses with the node between the diodes being connected to the end of the resistive path remote from the pad.

2. An integrated circuit device including a substrate of one conductivity type, two power supply buses, a terminal pad on said substrate, said pad having at least two sides, said substrate comprising a first diffusion region of an other conductivity type underlying the pad, and an electrostatic discharge protection circuit associated with said terminal pad, the protection circuit comprising:

a diode directly connected between said pad and one of said power supply buses, said diode comprised of said first diffusion region and a second diffusion region of said one conductivity type, adjacent one side of the pad and connected to said power supply bus, said first and second diffusion regions forming said diode;

a punchthrough transistor directly connected between said pad and said other power supply bus, said punchthrough transistor comprised of a third diffusion region of said other conductivity type, spaced from said first region and adjacent an other side of said pad, said third region being connected to said other power supply bus so that the substrate, said first and third diffusion regions form said punchthrough transistor; and a resistive path connecting said pad to the remainder of said integrated circuit, said resistive path comprised of said other conductivity type, whereby static charges applied to the pad are selectively transmitted to said one and said other power supply buses by means of said diode and said punchthrough transistor, respectively, so that the remainder of the integrated circuit is protected from said static charges, in which the protection circuit also includes a pair of diodes connected in series in a reverse bias configuration between the one and the other power supply buses with the node between the diodes being connected to the end of the resistive path remote from the pad, the protection circuit including a fourth region of the other conductivity type connected to the end of the resistive path and located adjacent the second diffusion region, a fifth diffusion region of the one conductivity type which is also connected to the other power supply bus located adjacent the fourth region to form with the fourth region a first of the pair of diodes, a sixth diffusion region of the one conductivity type which is connected in series with the fourth diffusion region and a seventh diffusion region of the other conductivity type which is connected to the one power supply bus and is arranged adjacent the sixth diffusion region to form the second of the pair of diodes.

3. A device according to claim 2, in which the fourth and fifth diffusion regions are adjacent at least part of the second diffusion region along one side of the pad, and the sixth and seventh diffusion regions are adjacent at least part of the third diffusion region along another side of the pad.

4. A device according to claim 5, in which the sixth and seventh diffusion regions are located in a well of the other conductivity type.

* * * * *